United States Patent [19]

Feinberg

[11] Patent Number: 4,636,578
[45] Date of Patent: Jan. 13, 1987

[54] PHOTOCELL ASSEMBLY

[75] Inventor: Stewart C. Feinberg, Exton, Pa.

[73] Assignee: Atlantic Richfield Company, Los Angeles, Calif.

[21] Appl. No.: 722,085

[22] Filed: Apr. 11, 1985

[51] Int. Cl.$^4$ .................... H01L 25/02; H01L 25/04
[52] U.S. Cl. .................................. 136/251; 136/259; 357/72; 29/588; 525/301; 525/293
[58] Field of Search .................. 136/251, 259; 29/588; 357/72

[56] References Cited

U.S. PATENT DOCUMENTS

| | | | |
|---|---|---|---|
| 4,210,462 | 7/1980 | Tourneux | 136/251 |
| 4,322,261 | 3/1982 | Dubois | 156/280 |
| 4,331,494 | 5/1982 | Duchateau et al. | 156/87 |
| 4,383,129 | 5/1983 | Gupta et al. | 136/251 |
| 4,426,240 | 1/1984 | Louis et al. | 156/99 |
| 4,499,658 | 2/1985 | Lewis | 29/588 |
| 4,542,257 | 9/1985 | Fraser et al. | 136/251 |
| 4,549,033 | 10/1985 | Avenel et al. | 136/251 |

FOREIGN PATENT DOCUMENTS 57-143872  9/1982  Japan ..................... 136/251

Primary Examiner—Aaron Weisstuch
Attorney, Agent, or Firm—Lewis J. Young

[57] ABSTRACT

Photocell modules wherein one or more photocells are encapsulated within a thermoplastic polymeric pottant between the layers of a rigid or flexible laminate. The pottant is a graft copolymer of (a) at least one addition polymerizable backbone monomer having a glass transition temperature ($T_g$) of less than 0°, (b) at least one addition polymerizable backbone monomer having a $T_g$ of 50°–150° C., and (c) a poly(vinyl aromatic) addition polymerizable macromonomer of 3,000–50,000 molecular weight having a $T_g$ of at least 30° C. The pottant is highly light-transmissive, electrically insulating and provides excellent protection for the photocells and circuitry at low cost.

11 Claims, 5 Drawing Figures

PHOTOCELL ASSEMBLY

BACKGROUND OF THE INVENTION

This invention relates to photoelectric transducer modules, also known as "photovoltaic" or simply "photocell" modules, and arrays incorporating a plurality of photocells such as solar panels and the like.

A critical consideration when assembling photocell modules, as represented by the solar cell modules and panels described in U.S. Pat. Nos. 3,957,537, 4,224,081, 4,322,261 and 4,331,494, is selection of the pottant material for encapsulating the fragile semi-conductor photocell wafers or disks employed in the modules. The pottant material must surround the semi-conductive disks and their connecting circuitry and support the disks between a transparent, light-transmissive first sheet and a second backing sheet. The backing sheet may also be transparent and light transmissive, but in most photocell assemblies comprises one or more rigid, semi-rigid or flexible support or load-bearing opaque sheets of glass, metal, fibrous material and/or plastic. The completed assembly is generally laminar and sometimes requires the application of primers or adhesives to one or more of the sheets to bind the various components together in a stable manner. Considerable technology has been developed in recent years as photocell assemblies have found increasing uses and achieved popularity in a wide variety of environments, from rooftop solar panels to micro-assemblies such as photocell energized watches and cameras.

The pottant material for encapsulating the photocell wafers must provide electrical insulation of the wafers and connecting circuitry, mechanical protection for the wafer themselves, corrosion protection for the metal contacts, and physical integrity of the circuitry and photocell assembly over an economically useful life of the assembly (usually 20 years in the case of roof-top solar panels). More specifically, the pottant material must be highly transparent and light-transmissive, electrically insulating, must be sufficiently soft to cushion the photocell wafers and to dampen vibration, must protect the cells from stresses due to thermal expansion differences and external impact, must have oxidative, hydrolytic and other chemical stability, and must have good adhesive properties. If the photocell assemblies are used in environments subject to changing conditions of temperature and weather, the pottant must have a glass transition temperature ($T_g$) below the lowest temperature extreme which the module might experience, and must also exhibit no significant mechanical creep at upper operating temperature extremes so that the laminar assembly will remain intact. Accordingly, for most rooftop solar cell applications and similar applications subject to the elements in northerly regions of the western hemisphere, the glass transition temperature must be below about $-40°$ C. and no significant mechanical creep should be experienced up to about $90°$ C.

Additional considerations in selecting an effective photocell pottant include melt viscosity/temperature relationship, the speed and ease with which photocell assemblies may be produced, and capability of recycling scrap pottant material. Concerning melt viscosity/temperature relationship, photocell assemblies are commonly produced by vacuum lamination in which the steeper the melt viscosity/ temperature curve for the pottant the greater the ease of processing. The pottant material, usually in the form of a polymeric sheet, must be dry and non-tacky during the initial evacuation step so as not to entrap air between the layers. However, the pottant must melt during the lamination to provide sufficient fluidity for penetration and wetting of all the irregularities of the cell circuit.

The foregoing and other considerations in selecting an effective pottant material for photocell assemblies are described in the technical literature such as the paper "Encapsulant Material Requirements for Photovoltaic Modules" by Katherine J. Lewis, American Chemical Society Symposium Series, *Polymers for Solar Energy*, 220, 367 (1983).

The major materials presently employed as photocell pottants are cross-linked ethylene-vinyl acetate (EVA) copolymer, polyvinyl butyral (PVB) and epoxy resin. All of these materials are deficient as photocell pottants in various ways. EVA copolymers have very low melt temperatures and therefore require cross-linking for improvement of their melt viscosity/temperature relationships, particularly for reducing photocell assembly production time. Also, EVA pottants contain residual peroxides and volatile by-products which lead to outgassing during photocell assembly production and therefore cause voids in the pottant and resultant delamination. The presence of volatile hydrolysis by-products in these pottants also contributes to product instability. Moreover, EVA pottants inherently are not sufficiently adhesive and require a primer for adequate bonding to other layers in the photocell assembly. Lastly, EVA pottants have crystalline regions which scatter light, thereby reducing optical clarity, and since the pottants are chemically cross-linked, scrap material cannot be recycled for subsequent photocell assembly production.

PVB pottants suffer from poor chemical resistance and hydrolytic stability, a tendency to absorb moisture, and inferior electrical properties. In addition, PVB requires a plasticizer for processability, but plasticizers reduce the volume resistivity of a polymer, leading to reduced electrical insulating properties. This can be somewhat offset by the use of a high volume resistivity layer in the photocell assembly, such as a polyethylene terephthalate film, but this complicates photocell assembly production and adds to cost.

Epoxy resin pottants have the disadvantages of chemical cross-linking, relatively complicated and long photocell assembly production times, high tensile modulus, and are incapable of being recycled for subsequent use in photocell assembly production.

Becaus of the deficiencies of the foregoing pottant materials, attention has focused on thermoplastic elastomers. Generally, these materials have steep melt viscosity/temperature curves for good processability, have high cohesive strength and toughness, and would be expected to lead to reduced photocell assembly times since peroxide or other types of chemical cross-linking are not required. However, these advantages in practice tend to be cancelled or offset by generally poor oxidative stability and reduced optical clarity, as evident in conventional styrene-diene thermoplastic elastomers.

SUMMARY OF THE INVENTION

It has now been found that certain thermoplastic polymeric materials provide the requisite combination of optical, electrical, mechanical and chemical properties for use as pottants in photocell assemblies satisfying the above-described requirements, particularly easy processability, excellent photocell and circuit protection, and low cost. Briefly, the pottant comprises a graft copolymer of (a) at least one addition polymerizable backbone monomer having a glass transition temperature ($T_g$) of less than 0° C., (b) at least one addition polymerizable backbone monomer having a $T_g$ of 50°–150° C., and (c) a macromonomer comprising poly (vinyl aromatic) of number average molecular weight of 3,000–50,000 and having an addition polymerizable end group, which macromonomer has a $T_g$ of at least 30° C.

One aspect of the invention, therefore, is a photocell assembly comprising first and second sheets in spaced apart, laminar arrangement, wherein at least the first sheet is transparent and light-transmissive, the sheets defining a cavity therebetween containing one or more photocells encapsulated within the thermoplastic polymeric pottant. Other aspects of the invention include photocell assemblies incorporating specific embodiments of the thermoplastic polymeric pottant, and specific embodiments of the photocell assemblies.

DETAILED DESCRIPTION

Figure 3:
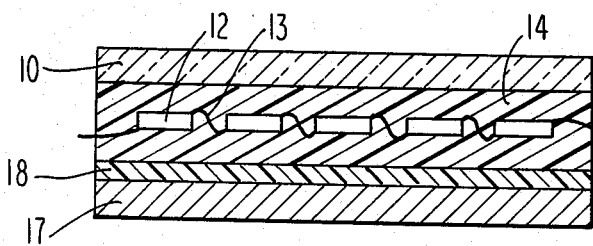
Figure 4:
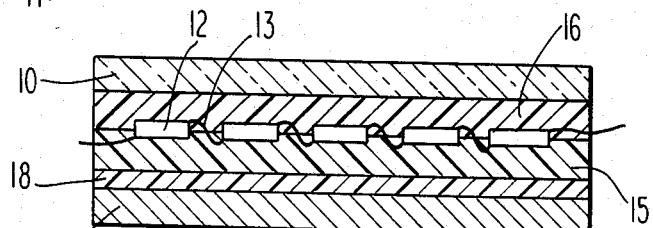
Figure 5:
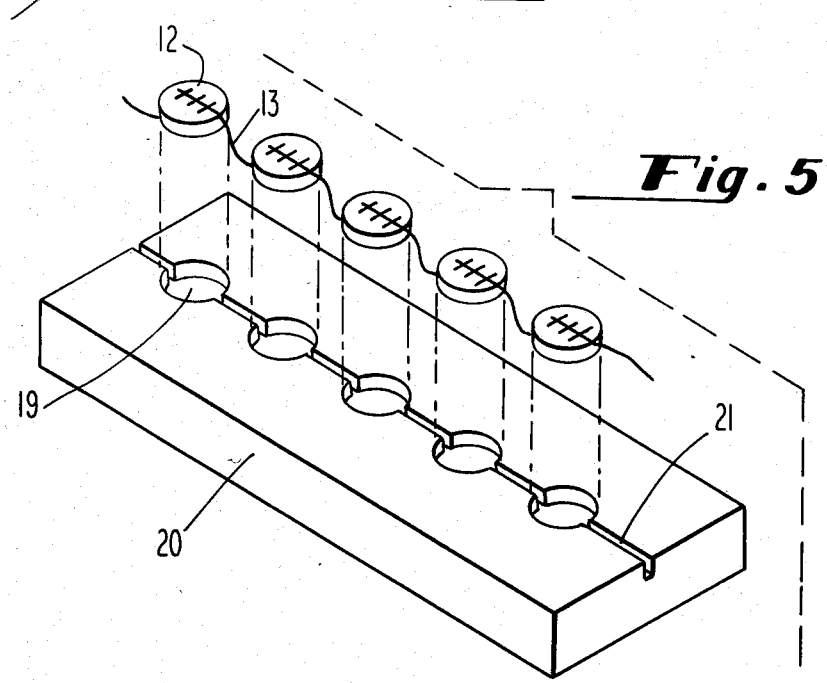

The invention will be better understood and appreciated with the aid of the appended schematic FIGS. 1–5 in which:

FIGS. 1–4 are cross-sectional views of four embodiments of photocell assemblies of the invention; and FIG. 5 is a perspective, exploded view of an alternate embodiment of the combination of a photocell array and encapsulating pottant layer, useful in another embodiment of photocell assembly of the invention.

Figure 1:
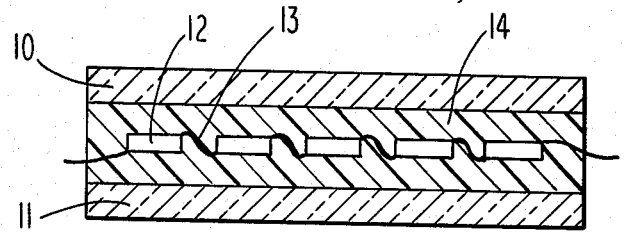

With reference to the drawings, FIG. 1 shows in laminar arrangement, first sheet 10 and second sheet 11 having encapsulated therebetween one or more photocells 12 interconnected by wiring 13 between contacts (not shown) embedded in the photocells. The photocells may be connected in series or parallel and may touch or overlap one another in accord with known arrangements. Photocells 12 are encapsulated by and suspended in a polymeric pottent material 14 further described below. The photocells 12 comprise well-known, somewhat brittle or otherwise fragile, semi-conductive disks or wafers which require protection against damage, particularly damage caused by shifting, bending, external loads and variations in temperature and weather. The interconnecting circuitry and electrical contacts embedded in or adjacent to the photocells require similar protection.

The first sheet or layer 10 must be transparent and light-transmissive. In a rigid photocell assembly, the first sheet may be glass or other rigid or semi-rigid material such as transparent polycarbonate or polymethacrylate. Second sheet 11 may be identical to first sheet 10 but in a photocell assembly intended for large structure use, such as rooftop solar panels, generally will be a rigid, support material such as opaque plastic, glass or wood.

In the assembly of FIG. 1 sheets 10 and 11 should be electrically insulating and have sufficient thickness and dimensional stability to contribute to the integrity of the completed photocell assembly. Sheets 10 and 11 alternatively may comprise flexible materials, such as plastic films having sufficient electrical insulating properties, whereby the photocell assembly is a thin film system which can be rolled up for storage for shipment and then unrolled for mounting on a substrate such as a roof. Materials useful for sheets 10 and 11, and photocells 12, are well known for both rigid and flexible photocell assemblies, such as described in the patents and technical paper identified above.

Figure 2:
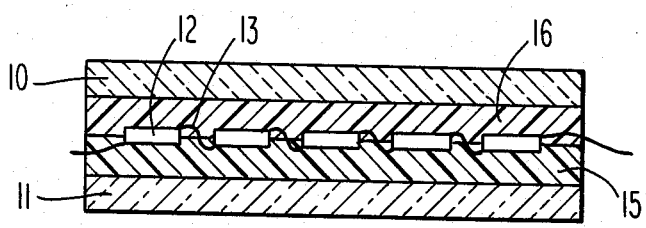

Whereas in FIG. 1 the photocells 12 are embedded along with their interconnects 13 in a single pottant layer 14 forming a continuum around the photocells and interconnects, as would be obtained by suspending the photocells and interconnects in molten elastomeric resin and then cooling, the encapsulating pottant material of FIG. 2 is preformed as dual, polymeric sheets 15 and 16. The photocell composite of FIG. 2 may be assembled by laying down on second sheet 11 a first polymeric sheet 15, inserting thereupon photocells 12 together with interconnects 13, and then superposing thereon second polymeric sheet 16 and top sheet 10. The composite is then heat and pressure laminated, or vacuum laminated at elevated temperature, whereby the polymeric sheets 15 and 16 soften and flow sufficiently around photocells 12 to encapsulate the photocells and interconnects and adhere to sheets 10 and 11 so as to integrate the composite into a photocell assembly.

In the embodiment of FIG. 3 a metallic sheet 17, such as sheet metal or metal foil, is employed as the substrate layer. However, the metal substrate will usually require interposition of a highly electrically insulating film or sheet 18 between metallic layer 17 and the pottant layer 14. Suitable, high volume resistivity insulating materials for this purpose include polymeric materials known for their high electrical insulating properties but otherwise unsuitable as pottants in accordance with the invention. Suitable insulating layer materials 18 therefore include crosslinked EVA and epoxy resins.

Similar to the photocell assembly of FIG. 2, FIG. 4 shows dual pottant sheets 15 and 16 encapsulating photocells 12 and interconnects 13 but utilizing, as in FIG. 3, a metallic substrate 17, such as sheet metal or metal foil, in place of the electrically insulating sheet 11 of FIGS. 1 and 2. However, as in FIG. 3, the assembly of FIG. 4 requires interposition of an electrically insulating sheet or film 18 between pottant layer 15 and metal sheet 17. The composite structure is then laminated as described with respect to FIG. 2 to flow pottant material of sheets 15 and 16 around photocells 12 and interconnects 13 for effective encapsulation.

FIG. 5 shows an alternate embodiment of pottant layer which can be used in combination with photocells in place of corresponding structure in the photocell assemblies of FIGS. 1–4. In place of suspending photocells and interconnects 13 in molten polymeric pottant material 14 as in FIGS. 1 and 3, or in place of compacting photocells 12 and interconnects 13 between dual sheets 15 and 16 of pottant material as in FIGS. 2 and 4, photocells 12 and interconnects 13 may be inserted in cutouts 19 in preformed pottant layer material 20, also containing slits 21 to receive interconnects 13. The cutouts 19 and the thickness of pottant layer 20 are selected such that upon heating and pressure compacting of layer 20 containing photocells 12 and interconnects 13, the pottant material of layer 20 will flow around the photocells and interconnects to encapsulate them similar to FIGS. 1–4. The embodiment of FIG. 5 thus provides for subassembly of photocells and encapsulating material, thereby facilitating production procedures in which storage and shipment from a remote source of such subassemblies is advantageous.

The pottant material of encapsulating layers 14, 15, 16 and 20 comprises a thermoplastic graft copolymer of (a) 50–90 wt. %, preferably 60–80 wt. %, based on graft polymer, of at least one addition polymerizable backbone monomer having a $T_g$ of less than 0° C., such as −20° C. to −100° C. or lower, preferably −40° C. to −70° C.; (b) 0-10 wt. %, preferably 1-5 wt. %, based on graft copolymer, of at least one addition polymerizable backbone monomer having a $T_g$ of 50°-150° C., preferably 80°-100° C.; and (c) 10-50 wt. %, preferably 20-40 wt. %, based on graft copolymer, of a macromonomer comprising poly (vinyl aromatic) of number average molecular weight of 3,000-50,000, preferably 10,000-35,000, and having an addition polymerizable end group, which macromonomer has a $T_g$ of at least 30° C., such as 50° C., to about 200° C., preferably 80°-100° C.

Accordingly, the pottants are thermoplastic polymeric elastomers based on macromolecular monomers (also known as "macromonomers") which are grafted as side chains onto a relatively soft backbone comprising monomers having a $T_g$ of less than 0° C., alone or in combination with other backbone monomers having a $T_g$ of 50°-150° C. The resultant graft copolymer is further characterized by the presence of vinyl aromatic macromonomer "domains" within a matrix comprising the backbone polymeric material. The vinyl aromatic macromonomer domains thus reinforce the graft copolymer without detracting from the thermoplastic character of the copolymer, which therefore remains "reversibly curable" by melting. The curing by solidification of these graft copolymers accordingly involves physical crosslinking as opposed to chemical crosslinking, thereby avoiding the irreversibility of epoxy and ethylene-vinyl acetate resin pottants.

As indicated, the backbone monomers (a) are "soft" monomers having a $T_g$ of less than 0° C. $T_g$ is a conventional criterion of polymer hardness and is described by Flory, "Principles of Polymer Chemistry", pages 56–57 (1953), Cornell University Press. See also "Polymer Handbook", Brandrup and Immergut, Section III, pages 144–148, Interscience (1975). While actual measurement of $T_g$ is preferred, it may be calculated as described by Fox, Bull. Amer. Physics Soc. I, III, page 123 (1956).

Monomers (a) having an appropriate $T_g$ are generally alkyl or alkoxy acrylates wherein the alkyl or alkoxy groups contain 1-20 carbon atoms of which the following together with $T_g$ (as homopolymer) are representative:

| | $T_g$ (°C) |
|---|---|
| n-butyl acrylate | −54 |
| 2-ethoxyethyl acrylate | −50 |
| 3-ethoxypropyl acrylate | −55 |
| 2-ethylbutyl acrylate | −50 |
| 2-ethylhexyl acrylate | −50 |
| n-heptyl acrylate | −60 |
| n-hexyl acrylate | −57 |
| 3-methoxybutyl acrylate | −56 |
| 3-methoxypropyl acrylate | −75 |
| n-octyl acrylate | −65 |
| 2-octyl acrylate | −45 |
| n-decyl methacrylate | −70 |

Preferred monomers (a) are acrylic or methacrylic acid esters of a non-tertiary alcohol, wherein the alcohol has from 1 to about 14 carbon atoms, preferably averaging about 4-12 carbon atoms.

Optional monomers (b) have a $T_g$ in the range of 50°-100° C. and are polar monomers capable of copolymerizing with monomers (a) and macromonomers (c) by addition. Representative (b) monomers include acrylic acid, methacrylic acid, itaconic acid, acrylamide, methacrylamide, acrylonitrile and methacrylonitrile, including mixtures of two or more thereof. Polar monomers (b) are particularly useful for improving the adhesive qualities and creep resistance of the graft copolymers. Acrylic acid is a preferred monomer for this purpose. If desired, a divalent cation, conveniently made available by an alkaline earth metal compound such as zinc or calcium oxide or hydroxide, may be added along with the polar monomer to cause crosslinking of the acrylic or methacrylic acid while also neutralizing the acid, thereby improving creep resistance. However, a polar monomer (b) also tends to increase melt viscosity, an undesirable effect. This consequence may be offset by a lower molecular weight macromonomer (c) but the lower molecular weight also gives poorer creep resistance. Accordingly, for a desirable balance of properties, it will be necessary in some cases to employ sufficient amounts of polar monomer (b), with or without ionic crosslinking thereof.

Macromonomers (c) comprise the so-called "living polymers" produced by anionic polymerization of one or more vinyl aromatic compounds in the presence of a lithium-based initiator such as lithium metal, alkyl lithium compounds, aryl lithium compounds or mixtures thereof such as disclosed in U.S. Pat. No. 3,317,918. The preferred initiators are alkyl lithium compounds such as the lower alkyl lithium compounds of which butyl lithium, e.g., secondary butyl lithium, is representative. Typical of the vinyl aromatic monomers useful in preparing macromonomers (c), are styrene, alpha-methyl styrene, nuclear-methyl styrene, indene, and p-tert.-butyl styrene. Mixtures of two or more thereof may be used if desired. The polymeric anion is then terminated with a compound which provides an addition polymerizable end group, such as acryloyl or methacryloyl chloride. The molecular weight distribution ("polydispersity") of the macromonomers may range up to 3 or more, preferably up to about 2.

Since in some cases the polymeric anion resulting from the anionic polymerization is highly reactive and non-selective in reaction with a terminating agent which incorporates an addition polymerizable group into the macromonomer, resulting in polymer chains having undesired functionality and molecular weight, the "living polymer" can be made less reactive by capping with a less reactive end group prior to termination. Suitable capping agents include lower alkylene oxides or sulfides such as ethylene and propylene oxide or sulfide.

A wide variety of macromonomers useful as macromonomers (c) in the present invention are known, together with synthesis, such as described in U.S. Pat. Nos. 3,786,116 and 3,842,059 to Milkovich et al, in European Patent Publication No. 104,046 filed Sept. 9, 1983 by Husman et al, and in the articles "Functionally Terminal Polymers via Anionic Methods" by D. N. Schultz et al, pages 427–440, Anionic Polymerization, American Chemical Society (1981) and "Monomers Polymerized by Anionic Initiators", Macromolecular Reviews, II, pages 74–83, Interscience Publishers, Inc. (1967). The disclosures of the aforementioned patents and publications are incorporated herein by reference.

The graft copolymers are prepared from monomers (a) (b) and (c) by conventional free radical polymerization techniques, for example, by dissolving the monomers in a suitable inert or inorganic solvent and reacting in the presence of a free radical initiator such as 2,2'-azobis (isobutyronitrile), tert-butyl hydroperoxide or benzoyl peroxide. In some cases, the organic solvent may comprise backbone monomer (a) or (b), or mixture thereof. The foregoing solution polymerization technique is preferred but the graft copolymerization may also be carried out by other polymerization methods, including suspension, emulsion and bulk polymerization.

The graft copolymer pottant materials share many similar characteristics with pressure sensitive adhesive ("PSA") compositions including hot-melt PSA's. Accordingly, many of the techniques for utilizing PSA's may also be used when employing the graft copolymers as pottants in accordance with the present invention. For example, liquid graft copolymer may be poured between first and second sheets positioned in a mold or other container and the photocell or photocells inserted therein at a suitable temperature and cure stage. Upon curing, the pottant material adheres to the sheets and the photocells, thereby forming the photocell assemblies depicted in FIGS. 1 and 3.

Alternatively, the graft copolymer may be solidified or extruded to form sheets of, for example, about 15-18 mil thickness which may be laminated between sheets 10 and 11 around one or more photocells and their interconnects as shown in FIGS. 2 and 4. Still further, by producing the graft copolymer pottants in sheets of sufficient thickness, cutouts may be provided to receive one or more photocells and interconnects, as shown in FIG. 5, and the resulting composite then laminated between first and second sheets 10, 11 to form assemblies such as shown in FIGS. 1-4. The system may be consolidated by conventional techniques, such as vacuum lamination, to provide the photocell assemblies of the invention.

The following description is intended to assist those skilled in the art to select suitable polymeric pottants for practice of the present invention but is not intended to limit the scope thereof. In the description and throughout the specification and claims, all parts and percentages are by weight and all temperatures are in °C. unless otherwise stated.

vide a 10% excess over theory. Styrene was then pumped into the reactor until a total of 1403 grams had been added. The temperature was maintained at 60° C. for 30 minutes and then 11.6 ml of ethylene oxide (20.2M) was added to provide an ethylene oxide/lithium mole ratio of 2/1, causing the solution to become colorless. To the resulting solution was added 22.9 ml of methacryloyl chloride ("MAC1", 10.2M) to provide a MAC1/lithium mole ratio of 2/1. A macromolecular monomer of 13,200 molecular weight, measured by GPC, was formed in the solution, having the structure:

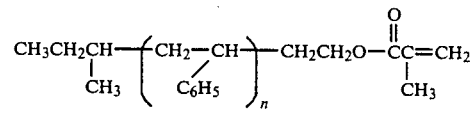

where n has a value such that the molecular weight is 13,200.

To another resin kettle was charged 780 grams of methyl ethyl ketone ("MEK"). The MEK was heated to reflux and a mixture of 585 grams of 2-ethyhexyl acrylate, 195 grams n-butyl acrylate, 722 grams of the macromonomer solution (54% macromonomer solids), and 3.9 grams of azobisisobutyronitrile initiator was then added to the refluxing MEK over 30 minutes. The resulting solution was held at reflux for 4.5 hours. Upon completion of reaction, the polymer solution has a theoretical total solids content of 51.3% and macromonomer conversion was 91%. Removal of the solvent under vacuum gave a clear tacky polymer having an apparent GPC peak molecular weight (polystyrene standard) of 123,000.

Table I below identifies the foregoing graft copolymer (P-1) and other graft copolymers prepared substantially as described above. The abbreviations in Table I have the following meanings:

n-BA = n-butyl acrylate
2-EHA = 2-ethylhexyl acrylate
AA = acrylic acid
MW = molecular weight (number average) by GPC

TABLE I

| | Graft Copolymers | | | | | | |
|---|---|---|---|---|---|---|---|
| Sample Number | Macromonomer MW | Wt. % | Macromonomer Conversion % | n-BA Wt. % | 2-EHA Wt. % | AA Wt. % | Copolymer Peak MW |
| P-1 | 13,000 | 33 | 88 | 17 | 50 | — | 123,000 |
| P-2 | 13,000 | 33 | 91 | 16 | 49 | 2 | 128,000 |
| P-3* | 13,000 | 33 | — | 25 | 42 | — | 162,000 |
| P-4* | 13,000 | 40 | 85 | 15 | 45 | — | 153,000 |
| P-5* | 13,000 | 33 | 81 | 24 | 41 | 2 | 147,000 |
| P-6* | 25,000 | 33 | 83 | 25 | 42 | — | 202,000 |
| P-7* | 25,000 | 33 | 84 | 17 | 50 | — | 179,000 |
| P-8* | 25,000 | 33 | 82 | 17 | 50 | — | 185,000 |
| P-9* | 25,000 | 33 | 83 | 24 | 41 | 2 | 148,000 |

*A stabilizer mixture was added to the copolymer solution, consisting of "Cyasorb UV 531", 0.3% (American Cyanamid), "Naugard P", 0.2% (Uniroyal) and "Tinuvin 770", 0.1% (Ciba-Geigy).

Preparation of Graft Copolymers

A resin reactor was charged with 1324 grams of cyclohexane, pre-dried over molecular sieves, and 400 grams of styrene purified over activated alumina. The reactor temperature was raised to 60° C. and s-butyllithium solution (1.31M in cyclohexane) was slowly added until a persistent light reddish-orange color was obtained. An additional 100 ml (0.117 moles) of the s-butyl-lithium solution was immediately added to pro- Samples of the graft copolymers of Table I were compression molded into films of 10-15 mil thickness (or other thickness as indicated) and evaluated for usefulness as solar cell pottants by measurement of the following properties as compared to commercially available pottant films of ethylene vinylacetate (EVA) and plasticized polyvinyl butyral (PVB):

A. Tensile modulus (psi)
B. Hardness: Shore A

C. Clarity: % transmission over 4000-7500 Angstrom range, Perkin Elmer 552A UV/VIS spectrophotometer
D. Weatherability: clarity after exposure in Xenon Weather-O-Meter
E. Adhesion: 90° Peel Test, kg/in.
  (a) To Tedlar® film
  (b) To glass or metal foil
F. Dielectric Strength: kV/mil (ASTM D-150, DC voltage)
G. Volume Resistivity: At 100 V, in ohm-cm, at room temperature (ASTM D-257).
H. Creep Resistance: In this test, as further described in "Creep Measurements on Solar Cell Encapsulants", alpha methylstyrene) will also improve creep resistance.

In other studies on viscosities of the polymeric pottants as a function of temperature, pottant P-1 had the lowest viscosity and steepest viscosity-temperature curve (logarithmic viscosity). This pottant also had the lowest copolymer molecular weight and the lower macromonomer molecular weight, indicating that these properties favor good melt viscosity-temperature relationships, but which must be balanced against creep resistance requirements. However, all of the pottants of the invention with the exception of P-6 and P-7 were below the required melt viscosity: $10^7$ cps or Ln 11.5 at processing temperature (150°-200° C.).

TABLE II

| TEST | Polymeric Pottants | | | | | | | | | | |
|---|---|---|---|---|---|---|---|---|---|---|---|
|  | P-1 | P-2 | P-3 | P-4 | P-5 | P-6 | P-7 | P-8 | P-9 | EVA | PVB |
| Tensile Modulus (psi) | 430 | | | | | | | | | | |
| Hardness, Shore A | 86-90 | | | | | | | | | | |
| Clarity, % transmission | 87-90$^{(1)}$ | — | 77 | 71 | 89, 87$^{(11)}$ | 64-67 | 70-78 80-82$^{(11)}$ | — | — | | |
| Adhesion, kg/in | | | | | | | | | | | |
| To film | 5.8$^{(2)}$ | 7.5$^{(2)}$ | | | | | | | | >5$^{(3)}$ <1$^{(2)}$ | |
| To glass, foil | >30$^{(10)}$ | >30$^{(10)}$ | | | | | | | | | <30$^{(3)}$ |
| Dielectric Strength, kV/mil. | 2.1 | 1.7 | | | | | | | | | 0.7-0.8 |
| Volume Resistivity, × $10^{-14}$ | 39 | 16 | | | | | | | | | 1 |
| Creep, % | | | | | | | | | | | |
| At 3.7 × load, 4 hrs | 0 | 0 | 0$^{(4)}$ | — | 0$^{(5)}$ | 0$^{(6)}$ | 0 | 0 | 0$^{(8)}$ | 0$^{(9)}$ | 0$^{(9)}$ |
| At 3.7 × load, 720 hrs | 100 | 19 | 0 | — | 0 | 0.6 | 12 | 100$^{(7)}$ | 0 | — | — |
| At 43 × load, 4 hrs | 8.8 | 1.7 | 0$^{(4)}$ | — | 0$^{(5)}$ | 0$^{(6)}$ | 1.1 | 11 | 0$^{(8)}$ | 0$^{(9)}$ | 0$^{(9)}$ |
| At 43 × load, 720 hrs | — | — | 20 | — | 19 | 32 | — | — | 100 | — | — |

(1)After 1077 hours in Weather-O-Meter
(2)Unprimed Tedlar TM film
(3)Tedlar TM film primed with amine primer
(4)Over 1-8 hours
(5)Over 1-24 hours
(6)Over 1-4 hours
(7)240 hours
(8)Over 1-24 hours
(9)Over 1-720 hours
(10)Substrate failed
(11)Of extruded/stabilized, dried down/unstabilized samples, respectively 13th Annual Conference, North American Thermal Analysis Society, Sept. 23-26, 1984, miniature test panels are used to simulate geometric conditions of load on encapsulants in a solar cell array. The panels were constructed of glass (3.2 mm thickness) and passivated steel (0.7 mm thickness) with polymeric test film (0.7-1 mm thickness) laminated between the glass and steel. Weights at slightly and significantly accelerated stress levels were hung from the steel and the panels were suspended in an oven at the accelerated test temperature (100° C.). Movement of the steel with time was monitored and reported as % creep at two load levels, 3.7 times normal use and 43 times normal use.

Table II shows superior adhesive and electrical properties of the macromonomer-based pottants of the invention. Hardness and clarity are within specifications for use as solar cell pottants and weatherability, even for unstabilized samples, was good. The creep resistance studies indicate that this property can be improved (reduced creep) by increased macromonomer conversion and/or molecular weight, by increased copolymer peak molecular weight, and/or by the incorporation of a small amount of a polar monomer (such as acrylic acid) in the copolymer. The data also suggests that selection of a macromonomer of higher $T_g$ (such as

I claim:
1. A photocell assembly comprising first and second sheets in spaced apart, laminar arrangement, said first sheet being transparent and light transmissive, said sheets defining a cavity therebetween, said cavity containing one or more photocells encapsulated within a thermoplastic polymeric pottant comprising a graft copolymer of
  (a) 50-90 wt. %, based on graft copolymer, of at least one addition polymerizable backbone monomer having a $T_g$ of less than 0° C.,
  (b) 0-10 wt. %, based on graft copolymer, of at least one addition polymerizable backbone monomer having a $T_g$ of 50°-150° C., and
  (c) 10-50 wt. %, based on graft copolymer, of a macromonomer comprising poly (vinyl aromatic) of number average molecular weight of 3,000-50,000 and having an addition polymerizable end group, said macromonomer having a $T_g$ of at least 30° C.
2. The photocell assembly of claim 1 wherein the macromonomer (c) comprises poly(vinyl aromatic) capped with alkylene oxide or alkylene sulfide and terminated with an alpha, beta monoethylenically unsaturated compound.

3. The photocell assembly of claim 1 wherein the $T_g$ of backbone monomer (a) is less than $-40°$ C., the $T_g$ of backbone monomer (b) is $80°-120°$ C., and the $T_g$ of graft macromonomer (c) is at least $80°$ C.

4. The photocell assembly of claim 1 wherein the backbone monomer component (a) comprises at least one alkyl ($C_1$-$C_{10}$) acrylate, backbone monomer component (b) comprises at least one monomer selected from acrylic acid, methacrylic acid, acrylamide or methacrylamide, and macromonomer (c) comprises polystyrene or poly (alpha-methylstyrene), capped with ethylene oxide and terminated with acryloyl halide or methacryloyl halide.

5. The photocell assembly of claim 4 wherein the $T_g$ of backbone monomer (a) is less than $-40°$ C., the $T_g$ of backbone monomer (b) is $80°-120°$ C., and the $T_g$ of macromonomer (c) is at least $80°$ C.

6. The photocell assembly of claim 5 wherein the backbone monomer component (a) comprises n-butyl acrylate, 2-ethylhexyl acrylate or a mixture thereof, backbone monomer (b) is acrylic acid, and macromonomer (c) is polystyrene capped with ethylene oxide and terminated with methacryloyl chloride.

7. The photocell assembly of claim 6 wherein the number average molecular weight of macromonomer (c) is about 10,000-35,000 and the number average molecular weight of the graft copolymer is about 100,000-200,000.

8. The photocell assembly of claim 6 wherein backbone monomer (a) comprises 60-80 wt. % of the graft copolymer, backbone monomer (b) comprises 0-5 wt. % of the graft copolymer, and macromonomer (c) comprises 20-40 wt. % of the graft copolymer.

9. The photocell assembly of claim 1 wherein said polymeric pottant is in the form of two sheets hot melted together on opposing sides of the photocell.

10. The photocell assembly of claim 1 wherein the second sheet comprises a metal layer and the assembly includes an electrical insulating sheet between said metal layer and the pottant material.

11. The photocell assembly of claim 1 wherein the pottant is in the form of a hot melt adhesive and the photocell is embedded in said adhesive.

* * * * *